United States Patent

Henkels et al.

[11] Patent Number: 5,995,425
[45] Date of Patent: Nov. 30, 1999

[54] DESIGN OF PROVABLY CORRECT STORAGE ARRAYS

[75] Inventors: Walter Harvey Henkels, deceased, late of Putnam Valley, by Lois E. Henkels, legal representative; Wei Hwang, Armonk; Rajiv Vasant Joshi, Yorktown Heights, all of N.Y.; Albert Thomas Williams, Austin, Tex.

[73] Assignee: International Business Machines Corporation, Armonk, N.Y.

[21] Appl. No.: 08/898,826

[22] Filed: Jul. 23, 1997

[51] Int. Cl.$^6$ ........................................ G11C 7/00

[52] U.S. Cl. ........................ 365/201; 365/230.08

[58] Field of Search ................... 365/200, 201, 365/189.07, 230.08, 189.05

[56] References Cited

U.S. PATENT DOCUMENTS 5,315,178  5/1994  Snider ........................ 365/189.02

*Primary Examiner*—Vu A. Le
*Attorney, Agent, or Firm*—F. Chau & Associates, LLP

[57] ABSTRACT

A hardware design technique allows checking of design system language (DSL) specification of an element and schematics of large macros with embedded arrays and registers. The hardware organization reduces CPU time for logical verification by exponential order of magnitude without blowing up a verification process or logic simulation. The hardware organization consists of horizontal word level rather than bit level. Using the elimination process for elements which are difficult to be extracted in Boolean form the logic around and inside a memory structure can be verified. The resultant register array hardware organization can be verified to all pins and nets up to the storage element.

7 Claims, 8 Drawing Sheets

FIG.1

DESIGN OF PROVABLY CORRECT STORAGE ARRAYS

BACKGROUND OF THE INVENTION

1. Field of the Invention

The present invention generally relates to design of provably correct arrays in complex logic and memory systems implemented in very large scale integrated (VLSI) circuits and, more particularly, to a hardware design technique that allows checking the design system language (DSL) specification of large macros with embedded arrays and registers.

2. Background Description

As the number of transistors used for complex logic and memory increases on a central processing unit (CPU) chip, the verification of intended functionality versus the actual functionality becomes a major task. To illustrate this point, many top level circuits as well individual circuits need to be evaluated with respect to static function, timing, testability of scan chain and manufacturability. As a result, a complete verification of logic and memory on a CPU chip is a necessity for low development cost and short design delivery cycles.

In the verification process, user-defined functions are checked at gate or transistor levels. The user defined functions are coded in Boolean algebra. The checking is done from top to bottom, which is termed as hierarchical.

The functional behavior of a high level system (e.g., a CPU chip) is validated by first modeling at an abstract level. This abstract level is simulated using a predesigned environment, such as running software applications or running a random set of processor instructions. Once the desired performance is achieved, the abstract model becomes the definition of the intended system function. This is often referred to as the "golden model".

The golden model can be synthesized to achieve gate levels description of the intended function. Conventionally, the synthesis is done automatically. The automation may limit the possible implementation of styles as it can grab fixed cells from the designated libraries. This may not result in optimization of area, timing and power. However, the synthesis maintains the functionality of the abstract specification, provided that the algorithms applied are correct. As a result, the functional verification is performed on the final design to confirm the validity of the synthesis algorithms.

Normally, the synthesis procedure is adopted for random logic especially when the synthesis rules are easily available (e.g., libraries, timing, pin information, etc.). It is easier to create libraries for static circuits. However, many times these limit the performance. As a result, a combination of dynamic and static circuits are used in to improve performance. In addition, circuits are tuned to the performance, and custom layouts to reduce area and power are heavily used. This is typically termed as custom or semi-custom (mixed static and dynamic) design. The custom design process is normally done independent of the "golden model". As a result, a separate functional verification step for the final implementation is very crucial. There are two approaches to custom circuit verification.

In the first approach, the switch level representation of complementary metal oxide semiconductor (CMOS) circuits is stimulated using the system level stimuli. The smaller granularity of this model causes a significant increase in simulation complexity. This reduces total number of patterns which in turn reduce the verification coverage. To resolve this problem, gate level model is abstracted from the transistor representation and by using hardware accelerators for switch level simulation. In spite of these developments these repeated functional simulations on the circuit level is highly time-intensive and difficult for user friendly applications.

A method to formally verify memory circuits based on the second approach compares transistor level logic (decoder, resets etc.) and memory and high level specification. Even though the specification is listed "fully functional", at the transistor level design may result in errors due to limitations on the test pattern coverages. Thus, by checking transistor level design with formal specification can produce robust design methodology. The goal here is to achieve substantial pattern coverage across the memory design.

The Present Problem

The verification of a memory unit is done by partitioning logic and array on the chip, since the verification system can not handle large systems as one entity. It is important to have a proper partitioning of the given memory system without blowing the verification environment. During the course of the design cycle, the high level model can go through some changes which may invalidate the transistor level representation. Also, when the memory contains some logic along with it, the verification of such a circuit becomes very difficult as latches or memory elements can not be modeled by Boolean expressions.

An example of a logic and memory circuit used in a microprocessor is given in FIG. 1. See, for example, U.S. Pat. Nos. 5,617,047 to W. H. Henkels et al. and No. 5,481,495 to W. H. Henkels et al., both assigned to the assignee of this invention. The description pertains to a register file with m word lines and n bit lines. The logic in FIG. 1 is denoted by write and read decoders and represented by blocks WRITE_A&B, READ_A, READ_B and READ_S respectively. A, B and S denote the port names. The addresses to the write decoder are given by WAA<0:4>, WBA<0:4>, WATS(Write address timing signal), WEA (Write Enable for port A) and WEB(Write Enable for port B). Addresses to the read ports are denoted by A<0:4> and their complements by AC<0:4>. These addresses create (in this case m word lines=32) word lines and read the appropriate data written in the array by triggering write word lines. In a conventional architecture, memory array A3 in FIG. 1 is organized to optimize the layout performance in a vertically bit-sliced way, as shown in FIG. 2. That is, a single write bit line would be written in a latch by triggering the pass gates by write word line. Then whatever is held in the latch is read by triggering the read word line and the data is transmitted across the read bit line to create a signal on the read bit line. Most of the time, the read word lines are banked into a desired number to create a pitch matched circuitry. In a vertical bit sliced fashion, the single read bit line is multiplexed with read word lines which are banked in a desired group. The output of such several multiplexers is then logically ORed to give the desired signal bit output.

If the logic of the design system language (DSL) written for verification of such a vertical bit-sliced organization is used to simulate the whole macro containing the array, then the a simulation model becomes five times larger, and simulation is five times slower since it is bit level rather word level.

The following example illustrates the present problem more clearly. For a register file with m=32 words by n=64 bits, vertical slicing results in 32×64=2048 latch elements (1-bit wide) being modeled. This results in a much larger simulation model and much slower simulation run times. The simulation modeling of each latch element requires a certain amount of overhead that is independent of the width. Horizontal slicing results in 32 latch elements (64 bits wide) being modeled. Since the number of latch elements is reduced, the model size is smaller and the simulation run time is faster.

Viewing simulation output is also complicated by vertical slicing. Vertical slicing causes each bit to have a unique facility name. Horizontal slicing allows an entire word (64 bits) to be accessed by a single facility name. Thus, it is difficult to debug the logic since only the register bits are accessible in the main simulation model and not the registers as a whole, and the vertical bit slicing makes "verification" process blow up in an exponential order of magnitude. In short, verification of the combination of logic and memory circuit puts constraints on the computational time and increases the complexity.

SUMMARY OF THE INVENTION

It is therefore an object of the invention to provide a process for verification of mixed logic and memory circuits.

It is another object of the invention to provide a method of designing provably correct arrays in mixed logic and memory circuits.

According to the invention, there is provided a method for incremental verification of mixed logic memory circuits by comparing a logical specification with a hierarchical representation of the circuit. The method comprises of the following steps.

Partitioning the logic specifications into hierarchies which represent a desired implementation.

Extracting the functional representation of each logic specification and actual implementation of logic associated with the memory.

While comparing the functionality of such a circuit, black boxing or eliminating the memory (latch) element and verifying other logic.

Arranging the memory (array) implementation in a horizontal bit-sliced fashion to improve the performance of the verification process and logic simulation process.

Verifying the black boxed latch element against multiple patterns and simulations.

If while verifying the logic specification with the implementation and the output nodes of the implementation are floating due to partitioning (i.e., pull-up device of the node is located in one hierarchy and pull-down device is located in another), then tying pull down node permanently with appropriate polarity and like-wise for pull-up which is another hierarchy).

a Proving functional equivalence of logic and memory element.

BRIEF DESCRIPTION OF THE DRAWINGS

The foregoing and other objects, aspects and advantages will be better understood from the following detailed description of a preferred embodiment of the invention with reference to the drawings, in which:

FIG. 3B is a block diagram showing inside A2-eight registers of the horizontally sliced array with respect to a word line, multiplexers and pulse choppers in between;

DETAILED DESCRIPTION OF A PREFERRED EMBODIMENT OF THE INVENTION

The process for verification is based on Boolean Extraction of the macro based on various algorithms. Such an extraction is compared with the logic representation. For memory and logic macros, the extraction is tightly coupled with the actual verification step. This makes it possible to efficiently handle special structures such as pass-transistor logic, false CMOS paths or circuits which contain combinatorial loops. This particular methodology checks dynamic circuits and nets which would potentially violate the combinatorial verification model. Also, the verification method for memory circuit is fully customized by user defined extraction rules, such as, for example, the dual rail signal inputs, elimination of resetting paths or precharge paths, black boxing unwanted elements etc. The rule set also includes tests for unwanted circuit situations such as nets which might have floating states.

Logic and Memory Circuit Verification

Figure 1:
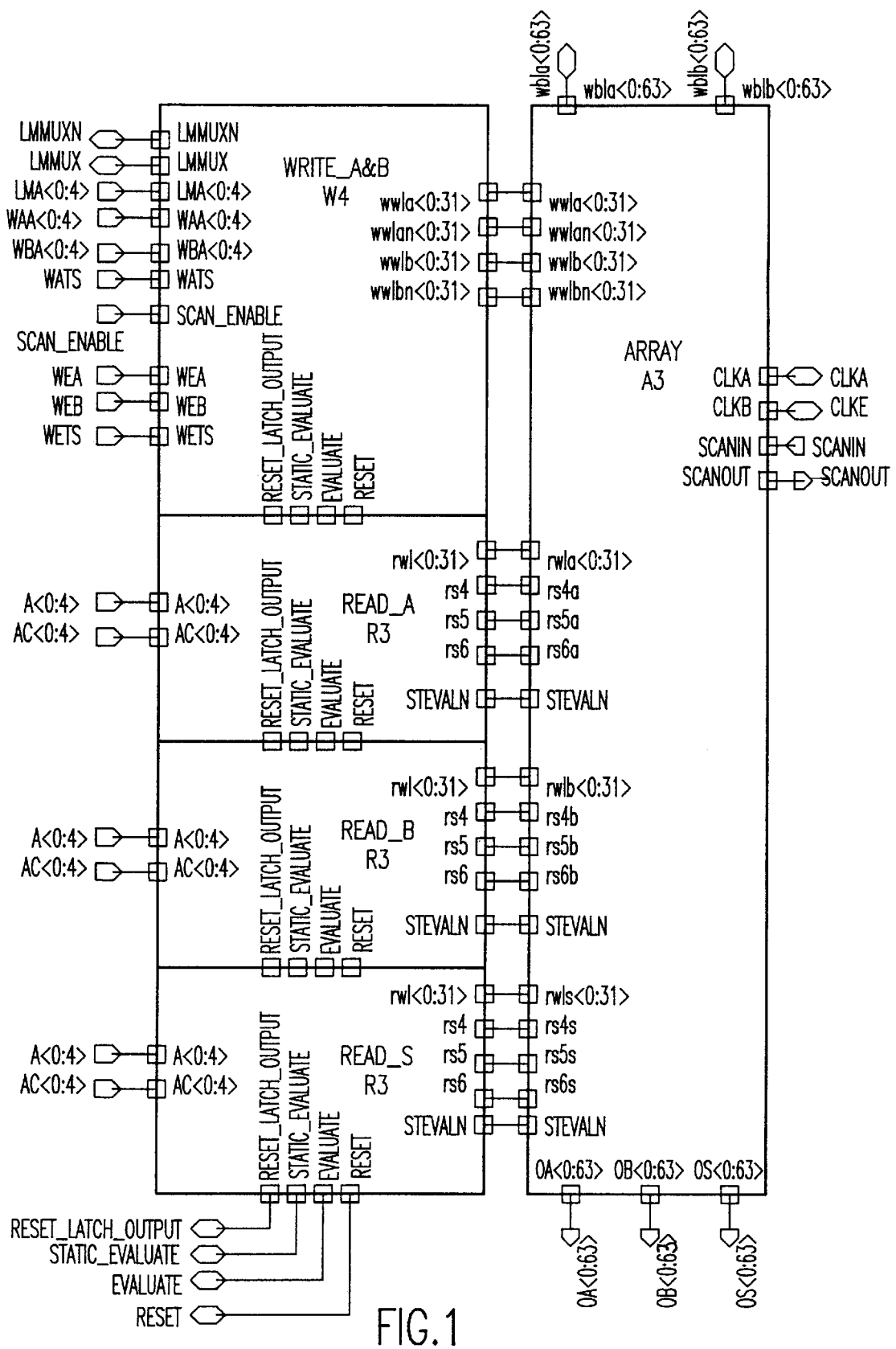
FIG. 1 is a block diagram of the main partition of multi-port register file with m word lines and n bit lines.
Figure 2:
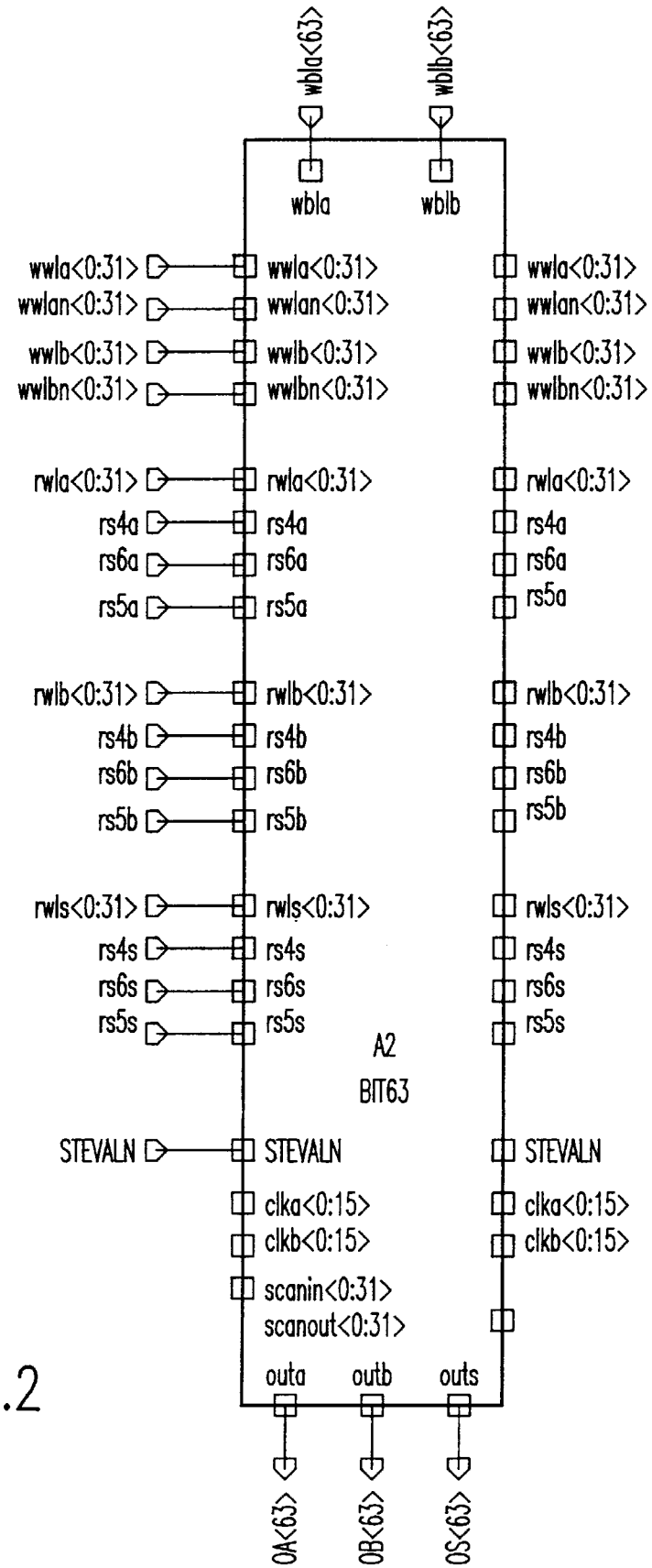
FIG. 2 is a block diagram showing the original vertical sliced array.

FIG. 1 shows an example of a memory circuit along with peripheral logic, in this case a register file. The file is partitioned into three parts for the verification process. READ and WRITE control form the logic portion, while the ARRAY forms the memory. The design hierarchy is already organized in this fashion. Almost all the combinational logic is in the READ and WRITE blocks while the ARRAY contains all the memory cells. A multiplexer (not shown) is the only logic in the ARRAY. The procedure is described here to verify such a mixed circuit containing logic and memories. The verification steps involve partitioning the logic, design and physical schematic arrangement of cells.

1. READ CONTROL—As shown in FIG. 1, READ control receives signals from external multiplexers. The dual rail signals or single addresses are decoded through the decoder by a 4-way NOR gate (not shown). The output of the NOR gate is logically ANDed with a delayed input address called pointer or strobe which forms the Least Significant Bit (LSB).

2. WRITE CONTROL—The write controls for the necessary ports consist of generation of dual rail signals internally from external addresses and a Write Address Timing Signal (WATS) and decoding them using an external input strobe WETS. The priority to write ports is obtained using a Write Enable address for A (WEA) and Write Enable for port B (WEB). For proper functionality of this circuit, the WATS and WETS signals need to be low all the time.

An example of the logical specification/representation of the READ CONTROL is given in APPENDIX 1. This specification is given for three READ PORTS A, B and S with dual rail signals. The three read ports are denoted by RAA(0 . . . 4) true and RAAN(0 . . . 4) their corresponding complements for read port A, RBA(0 . . . 4) true and RBAN(0 . . . 4) their corresponding complements for read port B, and RSA(0 . . . 4) true and RSAN(0 . . . 4) their corresponding complements for read port S. The logic of APPENDIX 1 shows how read word lines for each port are created; e.g., WLA (00) is a zero line number zero triggered by ANDing the complements of addresses RAA(0), RAA (1), RAA(2), RAA(3), and RAA(4), where "RAA" means "complement of". The sequence of forming word lines continues as per the logical ANDing of the combinations of addresses given in APPENDIX 1. A total of thirty-two word lines for each port are generated for all three ports. The logic for the write decoder (not shown in APPENDIX 1) is similar to that of the read decoder.

The above logic is implemented in the schematic. The READ and WRITE Controls are partitioned hierarchically as described above by the use of NOR and NAND circuitry and then top portion indicating the word line selection. After flattening the hierarchical schematic representation, the verification process extracts the Boolean function of the schematic design and compares with its logical representation as described in the APPENDIX 1.

Since READ and WRITE controls contain all logic which can be represented by the BOOLEAN function the verification process does not require black boxing or partial eliminating any schematic blocks.

Array Verification

In a microprocessor, the array is a basic unit which stores data. The data stored is read during the cycle. Such arrays contain registers and output multiplexers. For example, in an m×n register file where m=32 word line and n=64 bits, four multiplexers are dotted (ORed) to select thirty-two word lines. Normally, the hardware is organized to optimize the layout performance in a vertically bit-sliced way (FIG. 1) as described earlier. As mentioned earlier for the vertical bit slicing, verification and logic simulation requires an exponential order of magnitude CPU time.

Figure 3A:
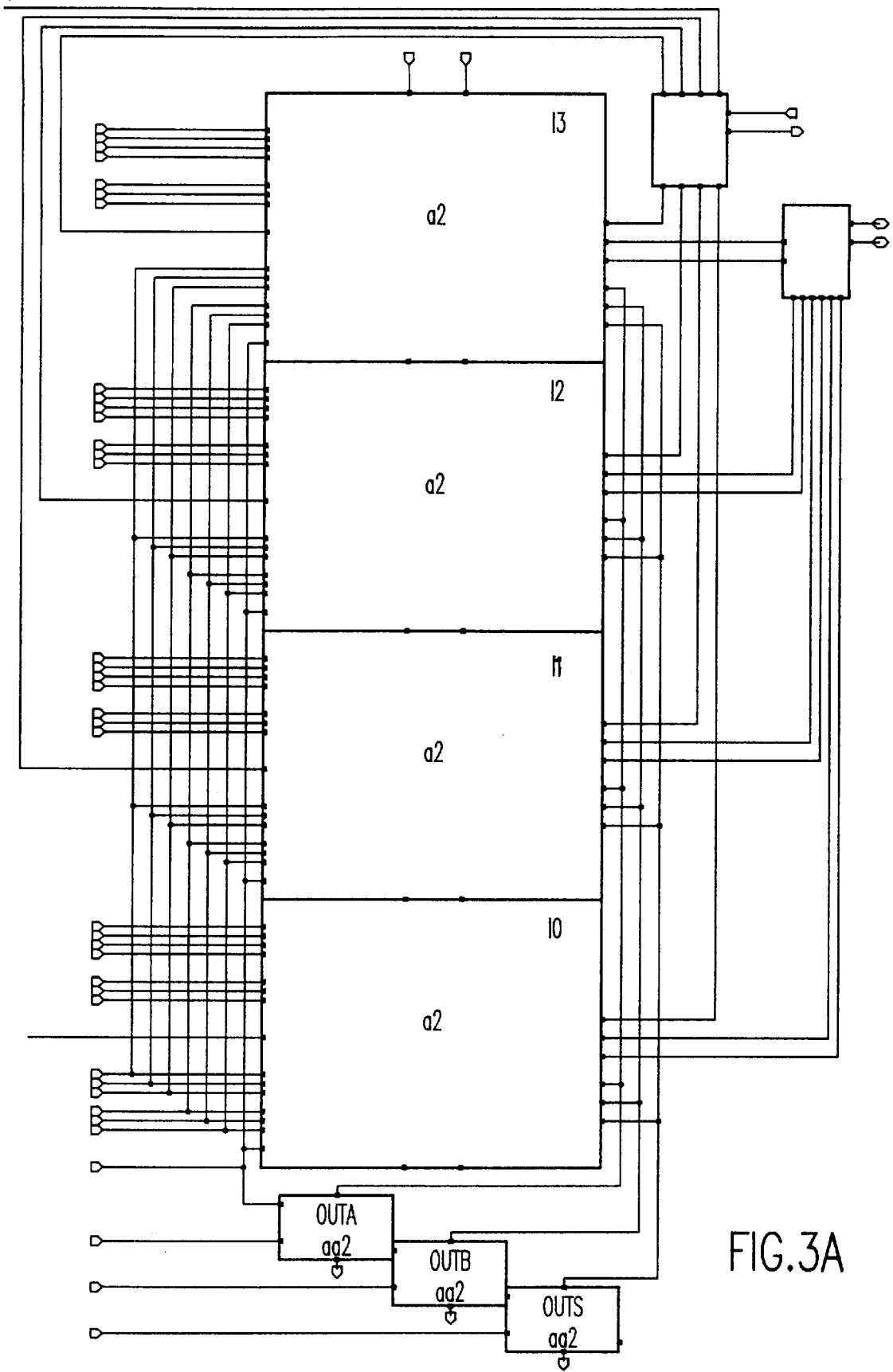
FIG. 3A is a block diagram showing new 4-A2 blocks for horizontal sliced array according to the present invention.
Figure 3B:
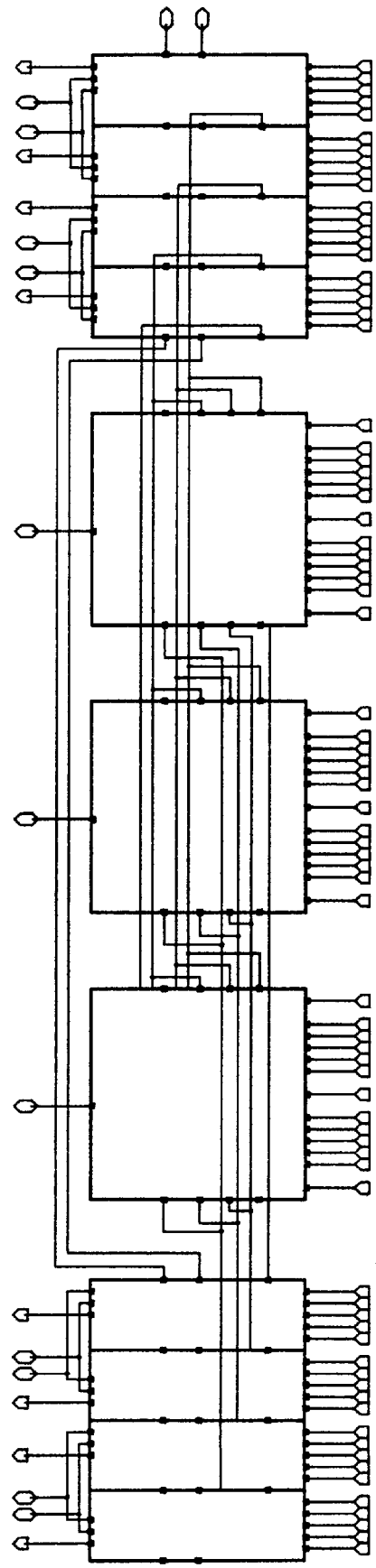
Figure 3C:
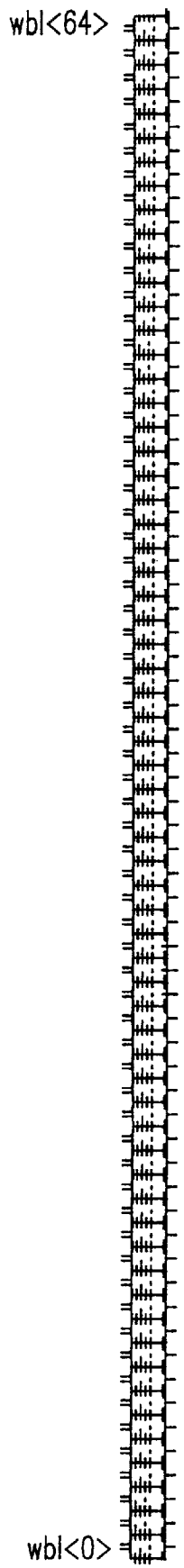
FIG. 3C is a block diagram showing a horizontal arrangement of the array.

To avoid the above problems and expedite the verification process, the original array (A3) which is shown in FIG. 1 is redesigned with thirty-two horizontal slices of sixty-four bit registers. Verification of the array itself is divided into two levels of hierarchy exploiting the natural partitions of the design. The top level A3 consists of four blocks A2 along with the output of the multiplexers and scan chains driven by two clocks, clock A and B. Within each A2 block there are eight registers A1 and three multiplexers AA1 corresponding to each port. The horizontal cross-section of register A1 is shown in FIG. 3C. As shown in the figure, there are sixty-four cells corresponding to each write bit line.

Figure 3D:
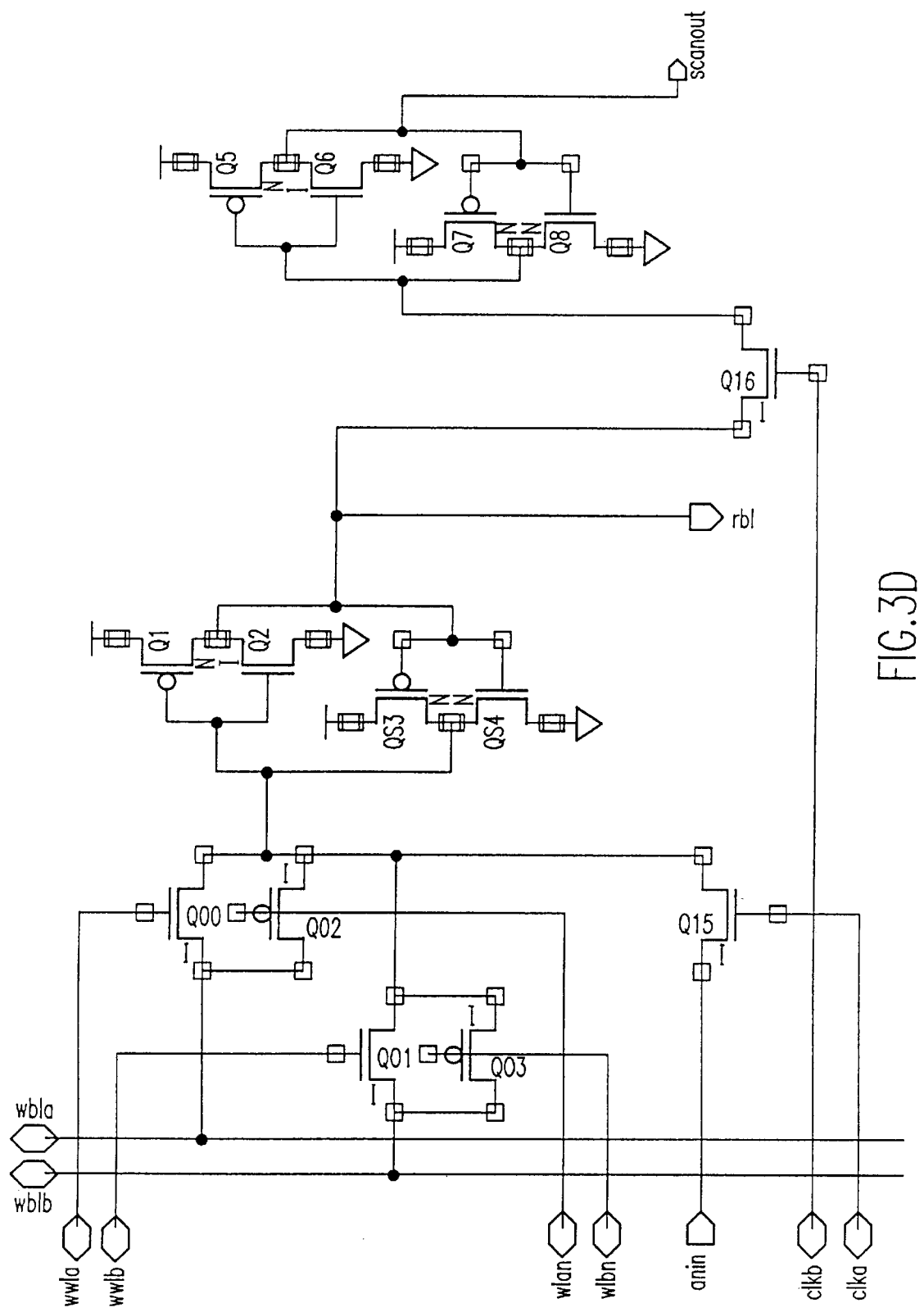
FIG. 3D is a schematic diagram of the circuit for a new multi-port register file cell for each of 64 bits according to the invention.

The schematic circuit diagram of each cell is the same and shown in FIG. 3D. True and complement write word lines wwla and wwlan write into a latch formed by cross-coupled inverters composed of complementary field effect transistor devices Q1, Q2 and QS3, QS4, respectively, via complementary pass gate pairs Q00, Q02 and Q01, Q03. The output of the latch is read bit line rbl. There are sixty-four read bit lines. The scanning is done by Level Sensitive Scan Design (LSSD) and is controlled by the CLOCK A and the CLOCK B via pass gates Q15 and Q16. The latch which functions as the LSSD scan chain is formed by cross-coupled inverters composed of complementary field effect transistor devices Q5, Q6 and Q7, Q8, respectively. Such a cell with pass gates and LSSD for scanning is novel.

The logic specification is partitioned to match the horizontal word line partitioning of the schematics as set out in APPENDIX 2. APPENDIX 2 describes the logic of the array including the multiplexers. WWLA(0 . . . 31) are the word lines for port A, and WWLAN (0 . . . 31) are the dual rail (complement) word lines for port A. Similarly, other word lines for ports B and S are specified in APPENDIX 2. For the hierarchy A2 word lines WWLA (0 . . . 7) are arranged to represent WWLA and, similarly, WWLAN (0 . . . 7) are arranged to represent WWLAN. The same is true for the other ports. This is a horizontal representation of word lines. The output is bits 0 to 63 for each port given by OUTA (0 . . . 63), etc. Thus, horizontal word line partitioning of word lines is very efficient form a simulation point of view. The other word lines (8 . . . 15), (16 . . . 23), (24 . . . 33) are partitioned eight word lines per bank. The DSL representation for other ports is very similar.

The input signals such as CLK_A(0 . . . 15) and CLK_B(0 . . . 15) propagate and show as the logical ORing of the internal propagating signals through the registers. The read RWLA(0 . . . 7), RWLB(0 . . . 7), RWLS(0 . . . 7) and write word lines WWLA(0 . . . 7), WWLB(0 . . . 7) and their complements are banked in 8×64 bit lines (suffixes stand for ports, i.e., port A, port B and port S). There are altogether four banks. However, write bits are banked into a bus of sixty-four (e.g., WBLA(0 . . . 63)). RS4A, RS6A, are the reset signals in the multiplexer line for port A, and STEVALN is static evaluate signal.

In the logic specification, a facility can be defined as any signal or net name in the logic design. An indexed facility is a facility with multiple bits (like WBLA(0 . . . 63)). Logic simulation requires a certain amount of overhead for each facility (it does not matter if the facility is indexed or not). This overhead includes a certain amount of memory for each facility as well as a certain amount of time to evaluate each facility. Thus, it is observed that simulation model requires less memory and less time to represent a 64-bit bus as an indexed facility rather than sixty-four individual facilities. For example, WBLA(0 . . . 63) is more efficient than WBLA0, WBLA1, WBLA2 etc. Such a representation reduces the CPU utilization during logic simulation.

Verification of such a hierarchical design is done by incremental verification. That is, A3 is the top level which contains blocks such as A2 and A1 and AA1 is checked. The verification task is to verify block A3, black boxing (meaning removing from the extraction process) A2 for the output logic. Sequential circuit elements or other design pieces which can not be modeled by Boolean logic such as memory cells (e.g., a latch) are excluded from the verification process by the black boxing process. The next step in the hierarchy is to verify A2 by black boxing A1 and AA1. Finally, AA1 (the multiplexer) is verified by black boxing AA1. Each register is later on verified by schematic simulation or "parching", but all the multiplexers and the interconnection between registers and read/write lines are checked by the Boolean extraction process. Parching means sending multiple patterns through the device and verifying the outputs against desired outputs.

Figure 4:
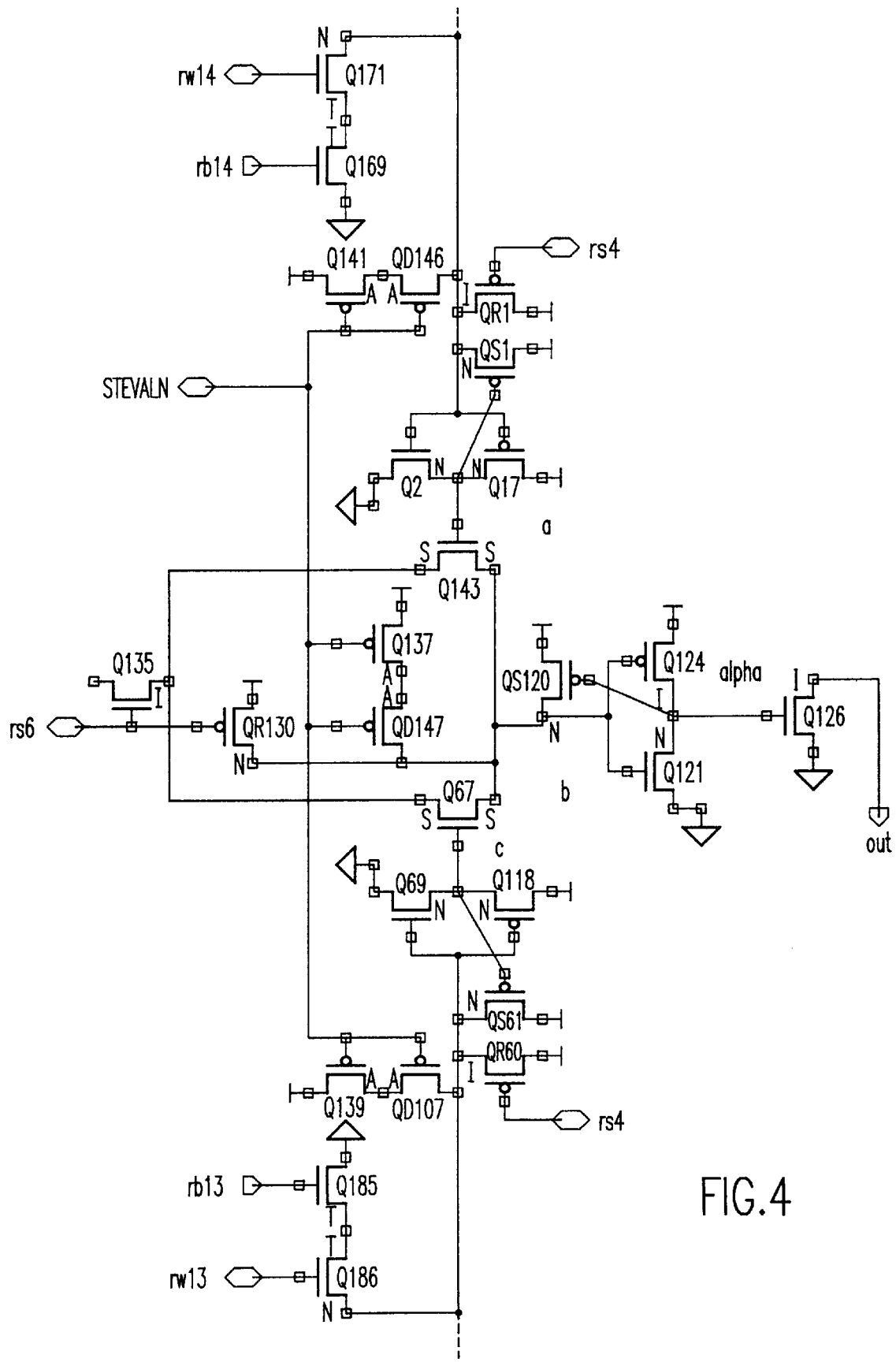
FIG. 4 is a schematic diagram of a pull-down output circuit of each multiplexer output bit.

The outputs of each register are logically ANDed with corresponding read word lines which are then logically ORed to form a four-way multiplexer as shown in FIG. 4. (Three other transistors on each side of the four-way multiplexer are not shown in the FIG. 4). As can be seen, there is a pull-down device Q126 which is inside the multiplexer for each horizontal register while pull-up device on that node is outside and contained in the "OUTPUT" of FIG. 3A. This shows that these two nodes are in a different hierarchy. Checking such a structure where two devices (pull-up and pull-down) on the same node but happen to be in different hierarchy poses a problem. Such a situation occurs quite frequently in dynamic circuits. By creating new node types during the verification process for each output or input where these devices exist, the extraction can be achieved. For example, a new node type PD_OUT can be created for verification of the output of the multiplexer shown in FIG. 4. A PD_OUT node is an output that always pulls down and the pull-up for that node is located elsewhere (in another black box or in the partition).

Figure 5:
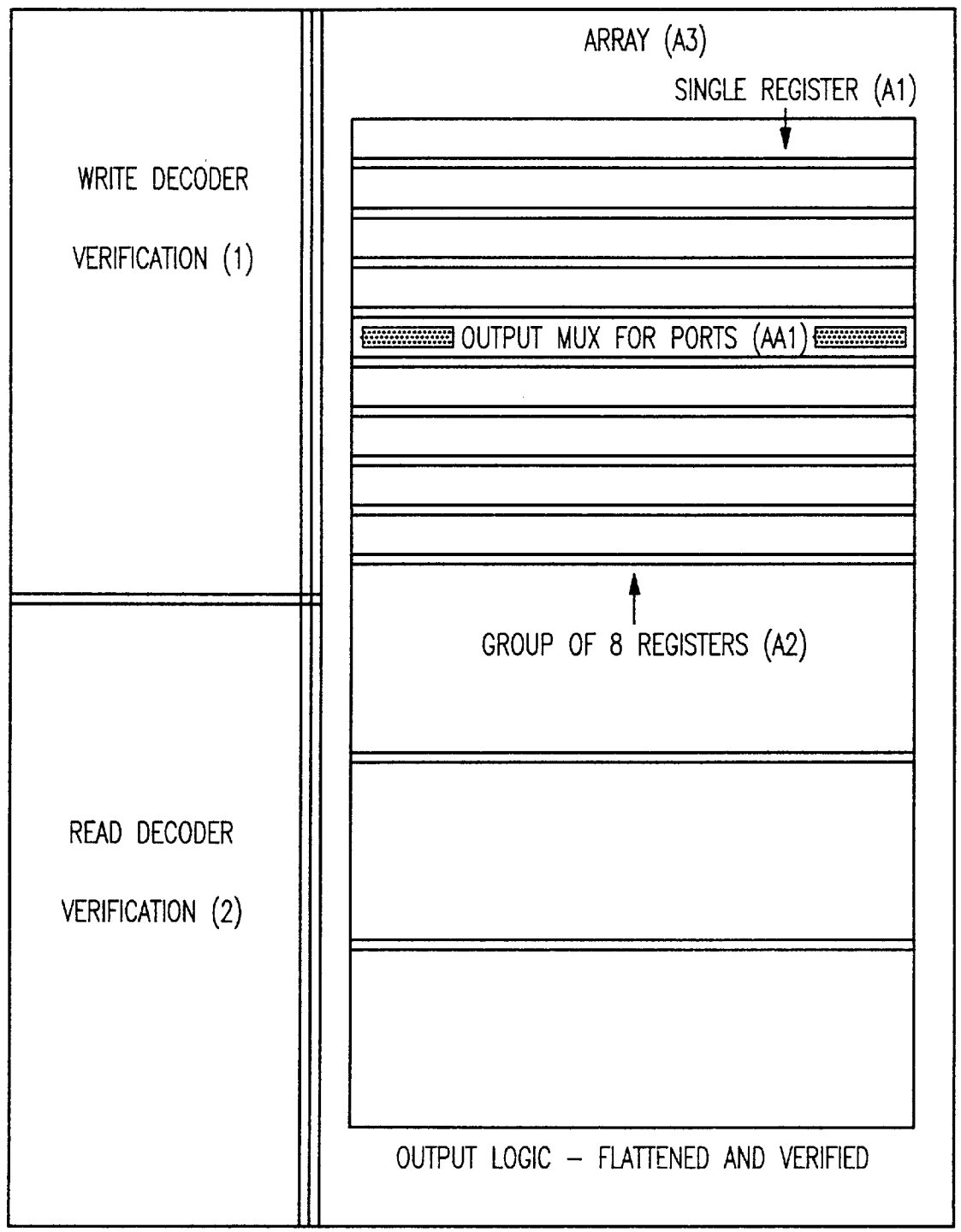
FIG. 5 is a block diagram of the overall verification view of the register file according to the invention.

The skeleton of the entire register file is shown in FIG. 5. Each verification process is identified in the figure by label. At each level the partitions below that level are black boxed for verification. In summary, the verification process is useful for a mixed logic and memory circuits and helps to reveal the functionality, net mismatches of the in the design. The coverage and confidence obtained through the use of verification is significantly greater than using the simulation. Using a simulator to obtain the same coverage instead of Boolean extraction require several hundred million patterns. The partitioning plays a major role in successful and an efficient verification process. It is important to match the hierarchy of register files between circuit and logic to get the maximum leverage from verification. If the devices on the same nodes with opposite polarity are contained in different hierarchy, then the verification can be achieved by creating additional node types and asserting them to level attained the devices on the node.

APPENDIX 1

```
DESIGN RDCD
ATTRIBUTE: TYPE='CUSTOM'
INPUT
      RAA(0..4):OB1,
      RAAN(0..4):OB1,
      RBA(0..4):OB2,
      RBAN(0..4):OB2,
      RSA(0..4):OB3,
      RSAN(0..4):OB3,
OUTPUT
      RWLA(0..31),
      RWLB(0..31)
      RWLX(0..31);
WLA(00)  :=   ^RAA(0) &   ^RAA(1) &   ^RAA(2) &   ^RAA(3) &   ^RAA(4);
WLA(01)  :=   ^RAA(0) &   ^RAA(1) &   ^RAA(2) &   ^RAA(3) &   ^RAA(4);
WLA(02)  :=   ^RAA(0) &   ^RAA(1) &   ^RAA(2) &    RAA(3) &   ^RAA(4);
WLA(03)  :=   ^RAA(0) &   ^RAA(1) &   ^RAA(2) &   ^RAA(3) &    RAA(4);
WLA(04)  :=   ^RAA(0) &   ^RAA(1) &    RAA(2) &   ^RAA(3) &   ^RAA(4);
WLA(05)  :=   ^RAA(0) &   ^RAA(1) &    RAA(2) &   ^RAA(3) &   ^RAA(4);
WLA(06)  :=   ^RAA(0) &   ^RAA(1) &    RAA(2) &   ^RAA(3) &   ^RAA(4);
WLA(07)  :=   ^RAA(0) &    RAA(1) &   ^RAA(2) &   ^RAA(3) &   ^RAA(4);
WLA(08)  :=   ^RAA(0) &    RAA(1) &   ^RAA(2) &   ^RAA(3) &   ^RAA(4);
WLA(09)  :=   ^RAA(0) &    RAA(1) &   ^RAA(2) &   ^RAA(3) &    RAA(4);
WLA(10)  :=   ^RAA(0) &    RAA(1) &   ^RAA(2) &   ^RAA(3) &   ^RAA(4);
WLA(11)  :=   ^RAA(0) &    RAA(1) &   ^RAA(2) &    RAA(3) &    RAA(4);
WLA(12)  :=   ^RAA(0) &    RAA(1) &    RAA(2) &   ^RAA(3) &   ^RAA(4);
WLA(13)  :=   ^RAA(0) &    RAA(1) &    RAA(2) &   ^RAA(3) &    RAA(4);
WLA(14)  :=   ^RAA(0) &    RAA(1) &    RAA(2) &    RAA(3) &   ^RAA(4);
WLA(15)  :=   ^RAA(0) &    RAA(1) &    RAA(2) &    RAA(3) &    RAA(4);
WLA(16)  :=    RAA(0) &   ^RAA(1) &   ^RAA(2) &   ^RAA(3) &   ^RAA(4);
WLA(17)  :=   ^RAA(0) &   ^RAA(1) &   ^RAA(2) &   ^RAA(3) &    RAA(4);
WLA(18)  :=   ^RAA(0) &   ^RAA(1) &   ^RAA(2) &   ^RAA(3) &   ^RAA(4);
WLA(19)  :=   ^RAA(0) &   ^RAA(1) &   ^RAA(2) &   ^RAA(3) &    RAA(4);
WLA(20)  :=    RAA(0) &   ^RAA(1) &    RAA(2) &   ^RAA(3) &   ^RAA(4);
WLA(21)  :=    RAA(0) &   ^RAA(1) &   ^RAA(2) &   ^RAA(3) &    RAA(4);
WLA(22)  :=    RAA(0) &   ^RAA(1) &    RAA(2) &   ^RAA(3) &   ^RAA(4);
WLA(23)  :=    RAA(0) &   ^RAA(1) &   ^RAA(2) &   ^RAA(3) &    RAA(4);
WLA(24)  :=    RAA(0) &    RAA(1) &   ^RAA(2) &   ^RAA(3) &   ^RAA(4);
WLA(25)  :=    RAA(0) &    RAA(1) &   ^RAA(2) &   ^RAA(3) &   ^RAA(4);
WLA(26)  :=    RAA(0) &    RAA(1) &   ^RAA(2) &   ^RAA(3) &   ^RAA(4);
WLA(27)  :=    RAA(0) &    RAA(1) &   ^RAA(2) &    RAA(3) &    RAA(4);
WLA(28)  :=    RAA(0) &    RAA(1) &    RAA(2) &   ^RAA(3) &   ^RAA(4);
WLA(29)  :=    RAA(0) &    RAA(1) &    RAA(2) &   ^RAA(3) &    RAA(4);
WLA(30)  :=    RAA(0) &    RAA(1) &    RAA(2) &    RAA(3) &   ^RAA(4);
WLA(31)  :=    RAA(0) &    RAA(1) &    RAA(2) &    RAA(3) &    RAA(4);
WLB(00)  :=   ^RAA(0) &   ^RBA(1) &   ^RBA(2) &    RBA(3) &    RBA(4);
WLB(01)  :=   ^RBA(0) &   ^RBA(1) &   ^RBA(2) &   ^RBA(3) &    RBA(4);
WLB(02)  :=   ^RBA(0) &   ^RBA(1) &    RBA(2) &    RBA(3) &    RBA(4);
WLB(03)  :=   ^RBA(0) &   ^RBA(1) &   ^RBA(2) &   ^RBA(3) &    RBA(4);
WLB(04)  :=   ^RBA(0) &   ^RBA(1) &    RBA(2) &   ^RBA(3) &   ^RBA(4);
WLB(05)  :=   ^RBA(0) &   ^RBA(1) &    RBA(2) &    RBA(3) &    RBA(4);
WLB(06)  :=   ^RBA(0) &   ^RBA(1) &    RBA(2) &   ^RBA(3) &   ^RBA(4);
WLB(07)  :=   ^RBA(0) &    RBA(1) &   ^RBA(2) &   ^RBA(3) &    RBA(4);
WLB(08)  :=   ^RBA(0) &    RBA(1) &   ^RBA(2) &   ^RBA(3) &   ^RBA(4);
WLB(09)  :=   ^RBA(0) &    RBA(1) &   ^RBA(2) &   ^RBA(3) &    RBA(4);
WLB(10)  :=   ^RBA(0) &    RBA(1) &   ^RBA(2) &    RBA(3) &    RBA(4);
WLB(11)  :=   ^RBA(0) &    RBA(1) &   ^RBA(2) &    RBA(3) &    RBA(4);
WLB(12)  :=   ^RBA(0) &    RBA(1) &    RBA(2) &   ^RBA(3) &   ^RBA(4);
WLB(13)  :=    RBA(0) &    RBA(1) &    RBA(2) &   ^RBA(3) &    RBA(4);
```

-continued

| | | | | | | |
|---|---|---|---|---|---|---|
| WLB(14) | := | ^RBA(0) & | RBA(1) & | RBA(2) & | RBA(3) & | ^RBA(4); |
| WLB(15) | := | ^RBA(0) & | RBA(1) & | RBA(2) & | RBA(3) & | RBA(4); |
| WLB(16) | := | RBA(0) & | ^RBA(1) & | ^RBA(2) & | ^RBA(3) & | ^RBA(4); |
| WLB(17) | := | RBA(0) & | ^RBA(1) & | ^RBA(2) & | ^RBA(3) & | RBA(4); |
| WLB(18) | := | RBA(0) & | ^RBA(1) & | ^RBA(2) & | RBA(3) & | ^RBA(4); |
| WLB(19) | := | RBA(0) & | ^RBA(1) & | ^RBA(2) & | RBA(3) & | RBA(4); |
| WLB(20) | := | RBA(0) & | ^RBA(1) & | RBA(2) & | ^RBA(3) & | ^RBA(4); |
| WLB(21) | := | RBA(0) & | ^RBA(1) & | RBA(2) & | ^RBA(3) & | RBA(4); |
| WLB(22) | := | RBA(0) & | ^RBA(1) & | RBA(2) & | RBA(3) & | ^RBA(4); |
| WLB(23) | := | RBA(0) & | ^RBA(1) & | RBA(2) & | RBA(3) & | RBA(4); |
| WLB(24) | := | RBA(0) & | RBA(1) & | ^RBA(2) & | ^RBA(3) & | ^RBA(4); |
| WLB(25) | := | RBA(0) & | RBA(1) & | ^RBA(2) & | ^RBA(3) & | RBA(4); |
| WLB(26) | := | RBA(0) & | RBA(1) & | ^RBA(2) & | RBA(3) & | ^RBA(4); |
| WLB(27) | := | RBA(0) & | RBA(1) & | ^RBA(2) & | RBA(3) & | RBA(4); |
| WLB(28) | := | RBA(0) & | RBA(1) & | RBA(2) & | ^RBA(3) & | ^RBA(4); |
| WLB(29) | := | RBA(0) & | RBA(1) & | RBA(2) & | ^RBA(3) & | RBA(4); |
| WLB(30) | := | RBA(0) & | RBA(1) & | RBA(2) & | RBA(3) & | ^RBA(4); |
| WLB(31) | := | RBA(0) & | RBA(1) & | RBA(2) & | RBA(3) & | RBA(4); |
| WLS(00) | := | ^RSA(0) & | ^RSA(1) & | ^RSA(2) & | ^RSA(3) & | ^RSA(4); |
| WLS(01) | := | ^RSA(0) & | ^RSA(1) & | ^RSA(2) & | ^RSA(3) & | RSA(4); |
| WLS(02) | := | ^RSA(0) & | ^RSA(1) & | ^RSA(2) & | RSA(3) & | ^RSA(4); |
| WLS(03) | := | ^RSA(0) & | ^RSA(1) & | ^RSA(2) & | RSA(3) & | RSA(4); |
| WLS(04) | := | ^RSA(0) & | ^RSA(1) & | RSA(2) & | ^RSA(3) & | ^RSA(4); |
| WLS(05) | := | ^RSA(0) & | ^RSA(1) & | RSA(2) & | ^RSA(3) & | RSA(4); |
| WLS(06) | := | ^RSA(0) & | ^RSA(1) & | RSA(2) & | RSA(3) & | ^RSA(4); |
| WLS(07) | := | ^RSA(0) & | ^RSA(1) & | RSA(2) & | RSA(3) & | RSA(4); |
| WLS(08) | := | ^RSA(0) & | RSA(1) & | ^RSA(2) & | ^RSA(3) & | ^RSA(4); |
| WLS(09) | := | ^RSA(0) & | RSA(1) & | ^RSA(2) & | ^RSA(3) & | RSA(4); |
| WLS(10) | := | ^RSA(0) & | RSA(1) & | ^RSA(2) & | RSA(3) & | ^RSA(4); |
| WLS(11) | := | ^RSA(0) & | RSA(1) & | ^RSA(2) & | RSA(3) & | RSA(4); |
| WLS(12) | := | ^RSA(0) & | RSA(1) & | RSA(2) & | ^RSA(3) & | ^RSA(4); |
| WLS(13) | := | ^RSA(0) & | RSA(1) & | RSA(2) & | ^RSA(3) & | RSA(4); |
| WLS(14) | := | ^RSA(0) & | RSA(1) & | RSA(2) & | RSA(3) & | ^RSA(4); |
| WLS(15) | := | ^RSA(0) & | RSA(1) & | RSA(2) & | RSA(3) & | RSA(4); |
| WLS(16) | := | RSA(0) & | ^RSA(1) & | ^RSA(2) & | ^RSA(3) & | ^RSA(4); |
| WLS(17) | := | RSA(0) & | ^RSA(1) & | ^RSA(2) & | ^RSA(3) & | RSA(4); |
| WLS(18) | := | RSA(0) & | ^RSA(1) & | ^RSA(2) & | RSA(3) & | ^RSA(4); |
| WLS(19) | := | RSA(0) & | ^RSA(1) & | ^RSA(2) & | RSA(3) & | RSA(4); |
| WLS(20) | := | RSA(0) & | ^RSA(1) & | RSA(2) & | ^RSA(3) & | ^RSA(4); |
| WLS(21) | := | RSA(0) & | ^RSA(1) & | RSA(2) & | ^RSA(3) & | RSA(4); |
| WLS(22) | := | RSA(0) & | ^RSA(1) & | RSA(2) & | RSA(3) & | ^RSA(4); |
| WLS(23) | := | RSA(0) & | ^RSA(1) & | RSA(2) & | RSA(3) & | RSA(4); |
| WLS(24) | := | RSA(0) & | RSA(1) & | ^RSA(2) & | ^RSA(3) & | ^RSA(4); |
| WLS(25) | := | RSA(0) & | RSA(1) & | ^RSA(2) & | ^RSA(3) & | RSA(4); |
| WLS(26) | := | RSA(0) & | RSA(1) & | ^RSA(2) & | RSA(3) & | ^RSA(4); |
| WLS(27) | := | RSA(0) & | RSA(1) & | ^RSA(2) & | RSA(3) & | RSA(4); |
| WLS(28) | := | RSA(0) & | RSA(1) & | RSA(2) & | ^RSA(3) & | ^RSA(4); |
| WLS(29) | := | RSA(0) & | RSA(1) & | RSA(2) & | ^RSA(3) & | RSA(4); |
| WLS(30) | := | RSA(0) & | RSA(1) & | RSA(2) & | RSA(3) & | ^RSA(4); |
| WLS(31) | := | RSA(0) & | RSA(1) & | RSA(2) & | RSA(3) & | RSA(4); |
| END DESIGN | | | | | | |

APPENDIX 2

```
DESIGN A3_NEW
ATTRIBUTE: TYUPE='CUSTOM';
INPUT
    WWLA(0..31),
    WWLAN(0..31),
    WWLB(0..31),
    WWLBN(0..31),
    RWLA(0..31),
    RWLB(0..31),
    RWLS(0..31),
    WBLA(0..63),
    WBLB(0..63),
    SCANIN,
    CLKA,
    CLKB,
    RS4A,
    RS6A,
    RS4B,
    RS6B,
    RS4S,
    RS6S,
    STEVALN;
OUTPUT
    OUTA(0..63),
    OUTB(0..63),
    OUTS(0..63)1
```

```
    SCANOUT;
    NOTFUNCTION is OR FOR OUTA, OUTB, OUTS;
    SCANOUT := FROM(31)
    TO(0..31) := SCANIN || FROM (0..30);
CLK_A(0..15)  :=CLKA || CLKA || CLKA || CLKA || CLKA || CLKA || CLKA || CLKA
              || CLKA || CLKA || CLKA || CLKA || CLKA || CLKA || CLKA || CLKA;
CLK_B(0..15)  :=CLKB || CLKB || CLKB || CLKB || CLKB || CLKB || CLKB || CLKB
              || CLKB || CLKB || CLKB || CLKB || CLKB || CLKB || CLKB || CLKB;
DEVICE I0 : A2
    WWLA(0..7)            |  WWLA        |
    WWLAN(0..7)           |  WWLAN       |
    WWLB(0..7)            |  WWLB        |
    WWLBN(0..7)           |  WWLBN       |
    RWLA(0..7)            |  RWLA        |
    RWLB(0..7)            |  RWLB        |
    RWLS(0..7)            |  RWLS        |
    WBLA(0..63)           |  WBLA        |
    WBLB(0..63)           |  WBLB        |
    TO(0..7)              |  SCANIN      |
    CLK_A(0..3)           |  CLKA        |
    CLK_B(0..3)           |  CLKB        |
    RS4A                  |  RS4A        |
    RS6A                  |  RS6A        |
    RS4B                  |  RS4B        |
    RS6B                  |  RS6B        |
    RS4S                  |  RS4S        |
    RS6S                  |  RS6S        |
    STEVALIN              |  STEVALN     |
                          |  OUTA        |  ... OUTA(0..63)
                          |  OUTB        |  ... OUTB(0..63)
                          |  OUTS        |  ... OUTS(0..63)
                          |  SCANOUT     |  ... FROM(0..7);
DEVICE I1 : A2
    WWLA(8..15)           |  WWLA        |
    WWLAN(8..15)          |  WWLAN       |
    WWLB(8..15)           |  WWLB        |
    WWLBN(8..15)          |  WWLBN       |
    RWLA(8..15)           |  RWLA        |
    RWLB(8..15)           |  RWLB        |
    RWLS(8..15)           |  RWLS        |
    WBLA(0..63)           |  WBLA        |
    WBLB(0..63)           |  WBLB        |
    TO(8..15)             |  SCANIN      |
    CLK_A(4..7)           |  CLKA        |
    CLK_B(4..7)           |  CLKB        |
    RS4A                  |  RS4A        |
    RS6A                  |  RS6A        |
    RS4B                  |  RS4B        |
    RS6B                  |  RS6B        |
    RS4S                  |  RS4S        |
    R565                  |  RS6S        |
    STEVALIN              |  STEVALN     |
                          |  OUTA        |  ... OUTA(0..63)
                          |  OUTB        |  ... OUTB(0..63)
                          |  OUTS        |  ... OUTS(0..63)
                          |  SCANOUT     |  ... FROM(8..15);
DEVICE J2 : A2
    WWLA(16..23)          |  WWLA        |
    WWLAN(16..23)         |  WWLAN       |
    WWLB(16..23)          |  WWLB        |
    WWLBN(16..23)         |  WWLBN       |
    RWLA(16..23)          |  RWLA        |
    RWLB(16..23)          |  RWLB        |
    RWLS(16..23)          |  RWLS        |
    WBLA(0..63)           |  WBLA        |
    WBLB(0..63)           |  WBLB        |
    TO(16..23)            |  SCANIN      |
    CLK_A(8..11)          |  CLKA        |
    CLK_B(8..11)          |  CLKB        |
    RS4A                  |  RS4A        |
    RS6A                  |  RS6A        |
    RS4B                  |  RS4B        |
    RS6B                  |  RS6B        |
    RS4S                  |  RS4S        |
    RS6S                  |  RS6S        |
    STEVALIN              |  STEVALN     |
                          |  OUTA        |  ... OUTA(0..63)
                          |  OUTB        |  ... OUTB(0..63)
                          |  OUTS        |  ... OUTS(0..63)
                          |  SCANOUT     |  ... FROM(16..23);
```

-continued

```
DEVICE I3 : A2
    WWLA(24..31)          |   WWLA       |
    WWLAN(24..31)         |   WWLAN      |
    WWLB(24..31)          |   WWLB       |
    WWLBN(24..31)         |   WWLBN      |
    RWLA(24..31)          |   RWLA       |
    RWLB(24..31)          |   RWLB       |
    RWLS(24..31)          |   RWLS       |
    WBLA(0..63)           |   WBLA       |
    WBLB(0..63)           |   WBLB       |
    TO(24..31)            |   SCANIN     |
    CLK_A(12..15)         |   CLKA       |
    CLK_B(12..15)         |   CLKB       |
    RS4A                  |   RS4A       |
    RS6A                  |   RS6A       |
    RS4B                  |   RS4B       |
    RS6B                  |   RS6B       |
    RS4S                  |   RS4S       |
    R565                  |   R565       |
    STEVALIN              |   STEVALN    |
                          |   OUTA       |   ... OUTA(0.. 63)
                          |   OUTB       |   ... OUTB(0..63)
                          |   OUTS       |   ... OUTS(0..63)
                          |   SCANOUT    |   ... FROM(24..31);
END DESIGN
```

While the invention has been described in terms of a single preferred embodiment, those skilled in the art will recognize that the invention can be practiced with modification within the spirit and scope of the appended claims.

Having thus described our invention, what we claim as new and desire to secure by letters patent is as follows:

1. A method for incremental verification of a memory and logic circuit comprising the steps of:

partitioning a logic specification of the memory and logic circuit by black boxing register elements in the circuit, said black boxing meaning removing from a subsequent extraction process;

then extracting a functional representation for each element of the logic specification and circuit implementation; and comparing a functional equivalence of logic and circuit implementation and proving the equivalence.

2. The method of claim 1 wherein proving the equivalence is achieved hierarchically in the comparing step.

3. The method in claim 1 wherein circuit representation consists of nodes which exist in different hierarchies and the verification step comprises the steps of:

creating different node types on said nodes which exist in different hierarchies with appropriate functional assertions;

assigning appropriate functional conditions for the functional representation at said nodes which exist in different hierarchies; and considering validity at an interface of these said nodes which exist in different hierarchies while comparing different hierarchies.

4. The method in claim 1 wherein a register element which is black boxed is simulated to check for its storage ability.

5. The method in claim 1 where a hierarchy between register file circuits is matched with a logic specification.

6. A method for verifying memory arrays wherein arrays are arranged in a horizontal row fashion along with its logic representation to design provably correct arrays comprising the steps of:

partitioning a logic specification of a memory by black boxing register elements in the circuit, said black boxing meaning removing from a subsequent extraction process;

then extracting a functional representation for each element of the logic specification and circuit implementation; and comparing a functional equivalence of logic and circuit implementation and proving the equivalence.

7. A method for incremental verification of memory and logic circuit comprising the steps of:

partitioning the logic specifications into hierarchies which represent a desired implementation;

extracting the functional representation of each logic specification and actual implementation of logic associated with the memory;

while comparing the functionality of such a circuit, black boxing or eliminating the memory (latch) element and verifying other logic;

arranging the memory (array) implementation in a horizontal bit-sliced fashion to improve the performance of the verification process and logic simulation process;

verifying the black boxed latch element against multiple patterns and simulations;

if while verifying the logic specification with the implementation and the output nodes of the implementation are floating due to partitioning, then tying pull down node permanently with appropriate polarity and likewise for pull-up which is another hierarchy; and proving functional equivalence of logic and memory element.

* * * * *